(12) United States Patent
Barringer et al.

(10) Patent No.: US 6,608,759 B1
(45) Date of Patent: Aug. 19, 2003

(54) DOCKING CASSETTE FOR PRINTED CIRCUIT BOARDS

(75) Inventors: Dennis R. Barringer, Wallkill, NY (US); Edward J. Seminaro, Milton, NY (US); Harold M. Toffler, Newburgh, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/085,444

(22) Filed: Feb. 28, 2002

(51) Int. Cl.⁷ .................................. H05K 5/00
(52) U.S. Cl. ........................ 361/759; 361/801
(58) Field of Search ............... 361/725–727, 361/732, 740, 753, 754, 796, 797, 798, 801, 807; 211/41.17; 439/152, 157, 377, 64, 76.1

(56) References Cited

U.S. PATENT DOCUMENTS

| | | | |
|---|---|---|---|
| 4,313,150 A | | 1/1982 | Chu |
| 4,498,123 A | | 2/1985 | Fuss et al. |
| 4,821,146 A | * | 4/1989 | Behrens et al. ............ 174/35 R |
| 5,285,353 A | | 2/1994 | Buck et al. |
| 5,297,000 A | | 3/1994 | Freige et al. |
| 5,325,269 A | | 6/1994 | Someno |
| 5,428,535 A | | 6/1995 | Katsumata et al. |
| 5,586,003 A | | 12/1996 | Schmitt et al. |
| 5,644,470 A | * | 7/1997 | Benedict et al. ............ 361/686 |
| 5,657,204 A | * | 8/1997 | Hunt ............................ 361/752 |
| 5,724,231 A | | 3/1998 | Winick et al. |
| 5,774,344 A | | 6/1998 | Casebolt |
| 5,890,920 A | * | 4/1999 | David et al. ................. 439/157 |
| 6,033,243 A | * | 3/2000 | Kajiura ........................ 439/157 |
| 6,061,244 A | | 5/2000 | O'Sullivan et al. |
| 6,115,258 A | * | 9/2000 | Hoyle et al. ............. 211/41.17 |
| 6,128,196 A | * | 10/2000 | Hoyle et al. ................. 206/454 |
| 6,219,252 B1 | * | 4/2001 | Tsai .......................... 174/35 R |
| 6,288,911 B1 | * | 9/2001 | Aoki et al. ............... 211/41.17 |
| 6,315,586 B1 | * | 11/2001 | Joyce et al. ................. 439/157 |
| 6,406,322 B1 | * | 6/2002 | Barringer et al. ........... 361/752 |

* cited by examiner

Primary Examiner—David Martin
Assistant Examiner—Thanh S. Phan
(74) Attorney, Agent, or Firm—Floyd A. Gonzalez; Cantor Colburn LLP

(57) ABSTRACT

A docking apparatus for printed circuit boards including a cassette housing, having a housing base, a housing cover and a housing wall, wherein the housing base and the housing wall are disposed relative to each other so as to define a housing cavity for containing a printed circuit board and wherein the housing wall includes a cable opening disposed so as to be communicated with the housing cavity, a linkage mechanism, wherein the linkage mechanism includes an engagement configuration and a disengagement configuration and wherein the linkage mechanism is disposed so as to be associated with the cassette housing and a housing bezel, wherein the housing bezel is disposed relative to the cassette housing so as to be associated with the cable opening.

16 Claims, 6 Drawing Sheets

DOCKING CASSETTE FOR PRINTED CIRCUIT BOARDS

GOVERNMENT RIGHTS

This invention was made with Government support under subcontract B338307 under prime contract W-7405-ENG-48 awarded by the Department of Energy. The Government has certain rights in this invention

FIELD OF THE INVENTION

The present invention relates generally to a docking cassette for printed circuit boards and more specifically to a docking cassette for printed circuit boards that acts as a guide and latch and provides the printed circuit board with a level of thermal and electrical protection.

BACKGROUND OF THE INVENTION

As integrated circuit (IC) and printed circuit board (PCB) design and fabrication techniques become more sophisticated, computer system design techniques must also become more sophisticated. This is because as IC's and PCB's become more densely populated, their performance capabilities and speeds increase and computer systems which employ these IC's and PCB's must be able to support the increase in performance. In addition, as businesses that employ these computer systems and components become more sophisticated, they demand greater performance from their computer systems resulting in increasingly densely populated PCB's and computer systems having tightly packed packages. As a result of these tightly packed packages, these PCB's and computer systems are susceptible to a variety of problems which must be considered.

First, they are more susceptible to damage and performance disruptions due to electromagnetic interference (EMI) effects. This is because as the processing speed of these PCB's and computer systems increase, the electromagnetic (EM) energy unintentionally radiated from these PCB's and computer systems similarly increases and any electrical circuit within the general area will receive this energy. If the circuit is not designed to dissipate this energy, performance disruptions and/or damage may result.

Second, they are more susceptible to damage and performance disruptions due to thermal effects. As components and circuits become smaller, their packaging becomes smaller thus allowing manufacturers and designers to more densely populate boards and systems. However, the smaller packaging means that there is less opportunity to dissipate heat generated by the component. As a result, any externally radiated heat from PCB's or components surrounding the smaller packaging is less likely to be dissipated, thus producing thermal damage and/or noise within the circuit and component Lastly, as the computer systems become more tightly packed, ingress and egress of system components becomes more difficult making system maintenance and repair cumbersome and arduous. This is because removing a PCB from a system or node is usually achieved by sliding the entire node in or out of a system via rails. This requires that the system provide proper mechanical clearances and additional cable length in order to support the movement of the rail which is often cumbersome and costly.

SUMMARY OF THE INVENTION

A docking apparatus for printed circuit boards comprising: a cassette housing, having a housing base, a housing cover and a housing wall, wherein the housing base and the housing wall are disposed relative to each other so as to define a housing cavity for containing a printed circuit board and wherein the housing wall includes a cable opening disposed so as to be communicated with the housing cavity; a linkage mechanism, wherein the linkage mechanism includes an engagement configuration and a disengagement configuration and wherein the linkage mechanism is disposed so as to be associated with the cassette housing; and a housing bezel, wherein the housing bezel is disposed relative to the cassette housing so as to be associated with the cable opening.

BRIEF DESCRIPTION OF THE DRAWINGS

Referring now to the figures, which are exemplary embodiments, and wherein the like elements are numbered alike.

DETAILED DESCRIPTION OF THE INVENTION

Figure 1:
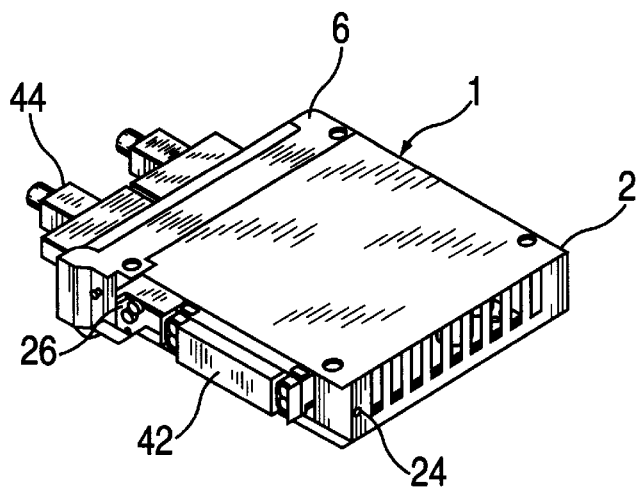
FIG. 1 is a perspective view of a docking cassette in accordance with an embodiment of the invention.
Figure 2:
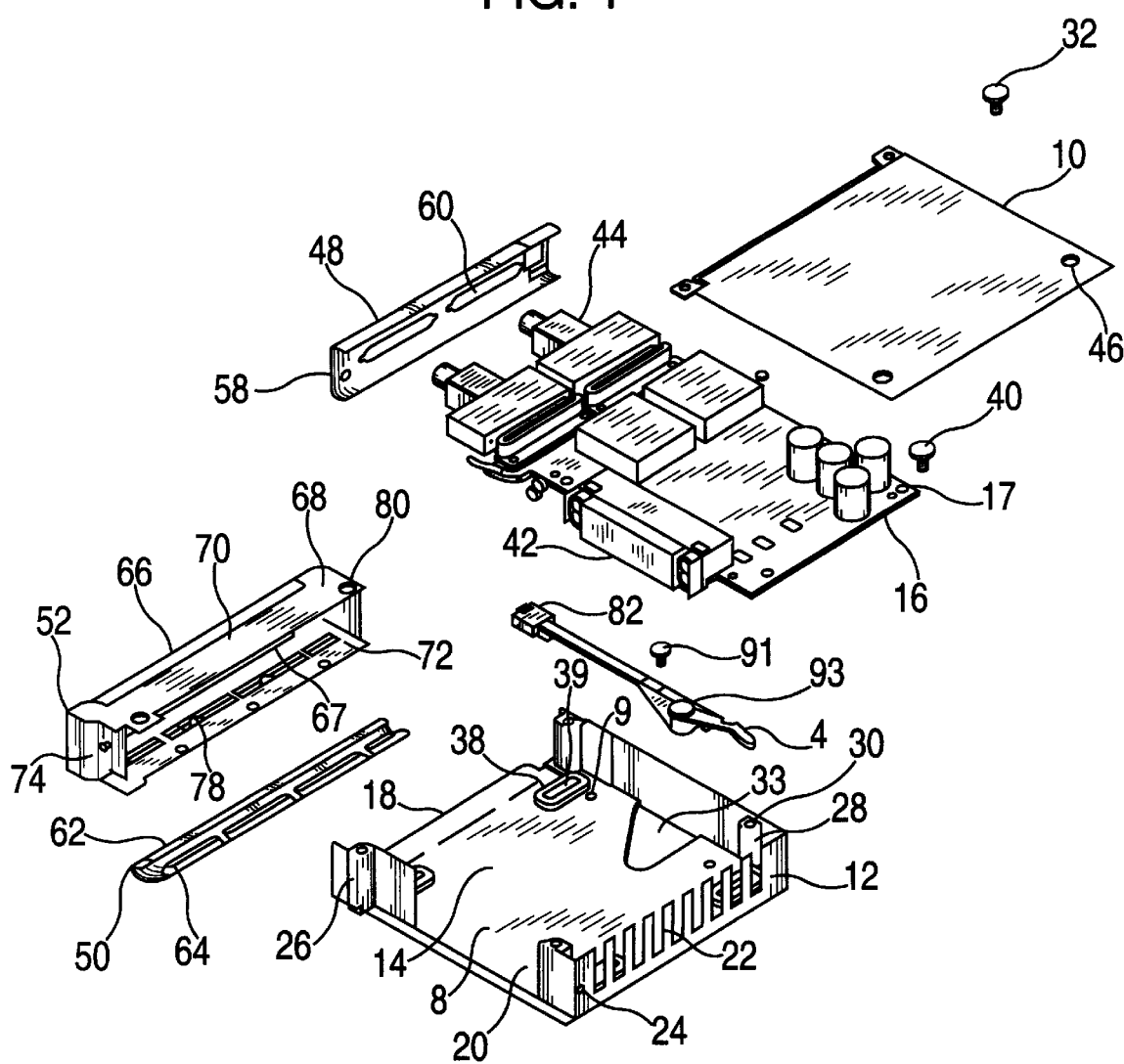
FIG. 2 is an exploded view of a docking cassette in accordance with an embodiment of the invention.
Figure 3A:
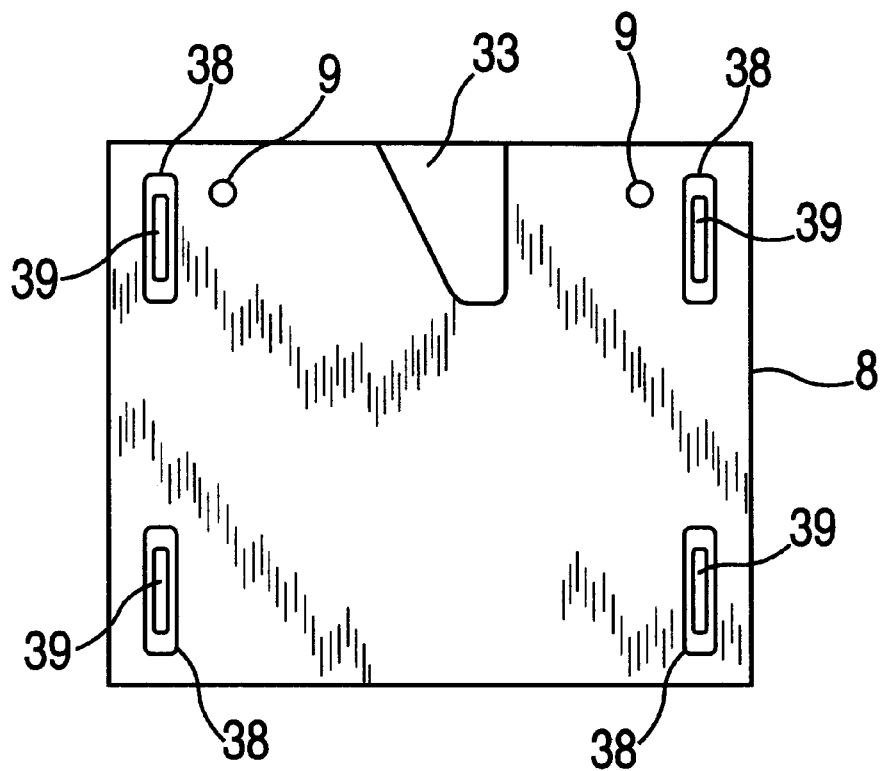
FIG. 3a is a top down view of a housing base in accordance with an embodiment of the invention.
Figure 3B:
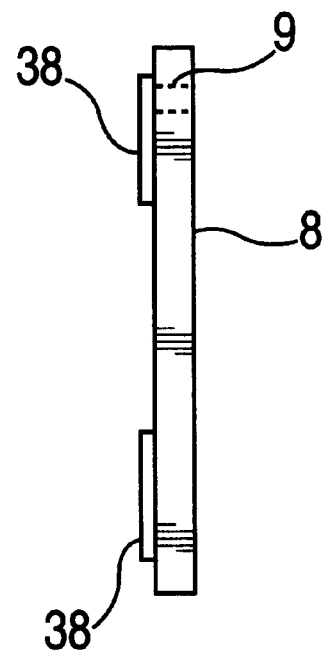
FIG. 3b is a side view of a housing base in accordance with an embodiment of the invention.

Referring generally to the figures, a docking apparatus 1 for mounting a printed circuit board (PCB) into a computer system is shown, in accordance with an embodiment of the invention. Docking apparatus 1 preferably provides structural support to the PCB so as to allow for the easy insertion and removal of the PCB from a computer system, as well as thermal and electrical isolation from other PCB's and components within the computer system.

Referring to FIG. 1, FIG. 2, FIG. 3a and FIG. 3b, a docking apparatus 1 for mounting a printed circuit board (PCB) in a computer system is shown, in accordance with an embodiment of the invention. Docking apparatus 1 preferably includes a cassette housing 2, a linkage mechanism 4 and a housing bezel 6. Cassette housing 2 preferably includes a housing base 8, a housing cover 10 and a housing wall 12, wherein housing base 8 and housing wall 12 are non-movably associated with each other and disposed relative to each other so as to define a housing cavity 14 for movably containing a PCB 16.

In accordance with an exemplary embodiment, housing base 8 preferably includes a linkage cavity 33 and four mounting devices 38 for movably holding PCB 16. PCB 16 preferably includes a PCB mounting mechanism 40 and mounting device 38 preferably includes a device opening 39 for slidingly containing PCB mounting mechanism 40, wherein PCB mounting mechanism 40 may be a screw, a pin or any mounting mechanism suitable to the desired end purpose. In addition, housing base 8 preferably includes a linkage mounting receptacle 9 for associating linkage mechanism 4 with housing base 8. In accordance with an exemplary embodiment, although linkage mounting receptacle 9 is preferably a receptacle opening for receiving a linkage mounting screw 91, linkage mounting receptacle 9 may be any receptacle device suitable to the desired end purpose, such as a clip receptacle. In accordance with an exemplary embodiment, it is considered within the scope of the invention that PCB 16 may be movably associated with housing base 8 using any device or method suitable to the desired end purpose, such as a screw or pin.

Housing wall 12 preferably includes a cable opening 18, a PCB connector opening 20 and a plurality of vent openings 22. In addition, housing wall 12 preferably includes a first protrusion 24 and a second protrusion 26, wherein first protrusion 24 and second protrusion 26 are disposed so as to lockingly engage with a main board of a computer system. In accordance with an embodiment of the invention, first protrusion 24 and second protrusion 26 are shown as being disposed on housing wall 12. However, it is considered within the scope of the invention that first protrusion 24 and second protrusion 26 may be disposed anywhere on cassette housing 2 in a manner suitable to the desired end purpose. Moreover, housing wall 12 preferably includes at least one mounting structure 28 which defines a threaded cavity 30 for receiving a mounting apparatus 32, such as a screw. In addition, PCB connector opening 20 and cable opening 18 are preferably disposed so as to allow communication with the PCB connector 42 and the PCB cable connections 44 when PCB 16 is disposed within housing cavity 14.

Housing cover 10 preferably includes at least one cover opening 46 disposed so as to allow communication with mounting structure 28 when housing cover 10 is associated with housing wall 12. Cover opening 46 is preferably disposed so as to allow mounting apparatus 32 to communicate with threaded cavity 30 for non-movably associating housing cover 10 with housing wall 12. Although an exemplary embodiment describes housing cover 10 being non-movably associated with housing wall 12, it is considered within the scope of the invention that housing cover 10 may also be non-movably associated with housing base 8 and/or housing wall 12 using any mounting device or method suitable to the desired end purpose.

In accordance with an embodiment of the invention, housing bezel 6 preferably includes an inner bezel 48, an outer bezel 50 and a tail-stock mechanism 52. Inner bezel 48 preferably includes a forward bezel wall 58 having at least one forward opening 60. Outer bezel 50 preferably includes a forward outer flange 62 and a rear outer flange 64. Tail-stock mechanism 52 preferably includes a tail-stock front 66 having a tail-stock front opening 67 and a tail-stock wall 68 having a tail-stock top 70, a tail-stock bottom 72 and a tail-stock side 74. In accordance with an embodiment of the invention, tail-stock front 66 and tail-stock wall 68 are preferably non-movably associated with each other so as to form a tail-stock cavity 76. In addition, tail-stock bottom 72 preferably includes at least one flanged opening 78. Tail-stock top 70 also preferably includes at least one tail-stock mounting hole 80 for mounting housing bezel 6 to cassette housing 2.

Figure 4:
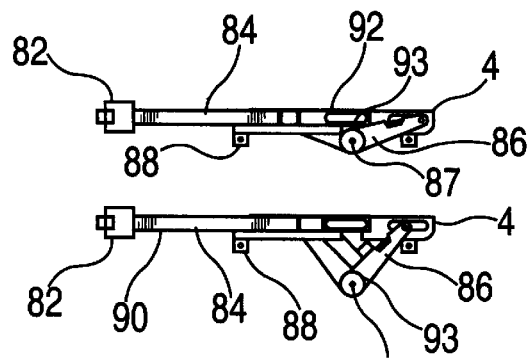
FIG. 4 is a side view of a linkage mechanism shown in the "engagement" configuration and the "disengagement" configuration.
Figure 5A:
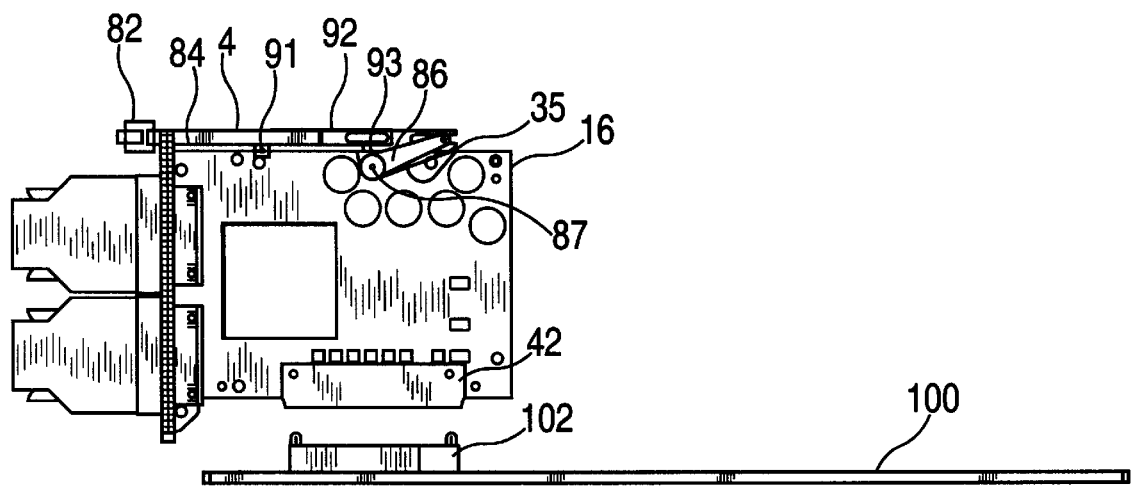
FIG. 5a is a cross sectional side view of a docking cassette being disposed within a computer system with linkage mechanism in the "disengagement" configuration in accordance with an embodiment of the invention.
Figure 5B:
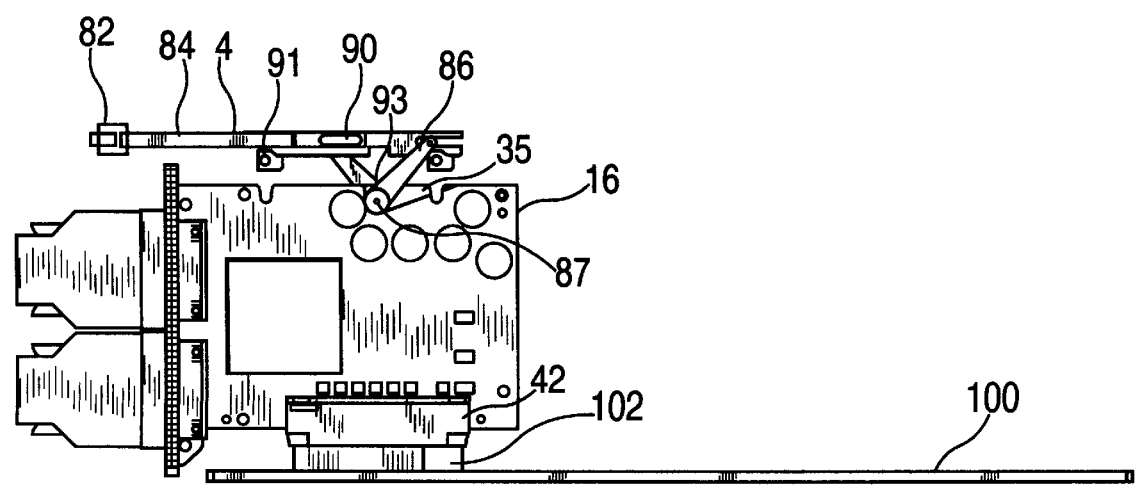
FIG. 5b is a cross sectional side view of a docking cassette being disposed within a computer system with linkage mechanism in the "engagement" configuration in accordance with an embodiment of the invention.
Figure 6A:
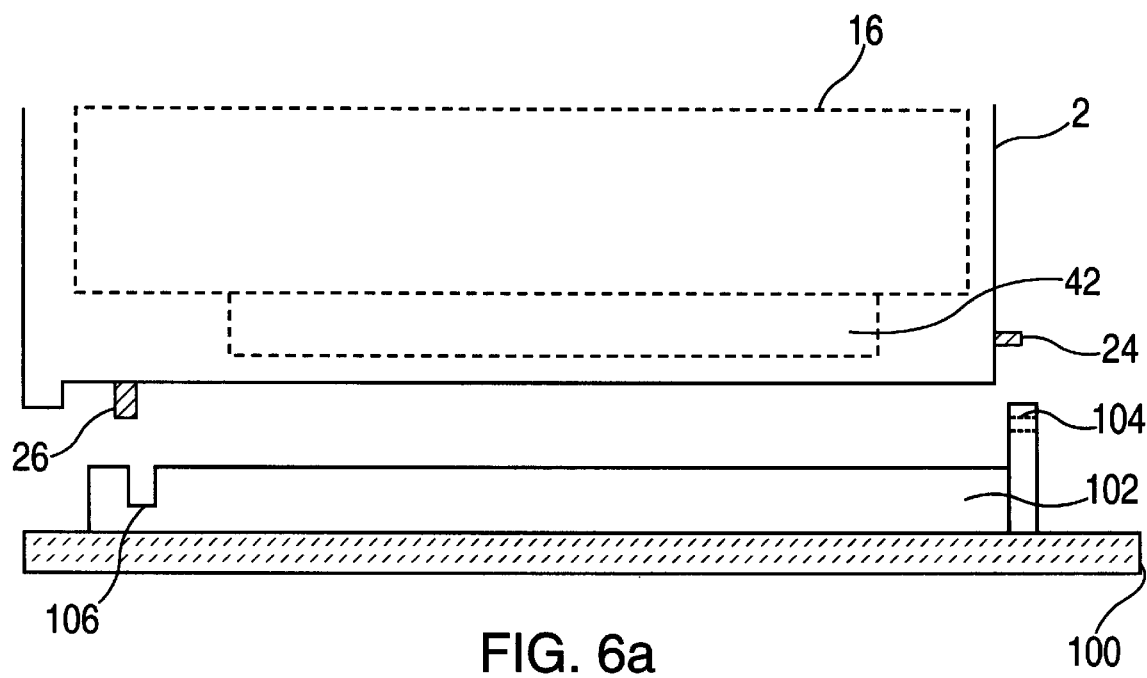
FIG. 6a is a side view of a docking cassette and a computer system main board prior to docking in accordance with an embodiment of the invention.
Figure 6B:
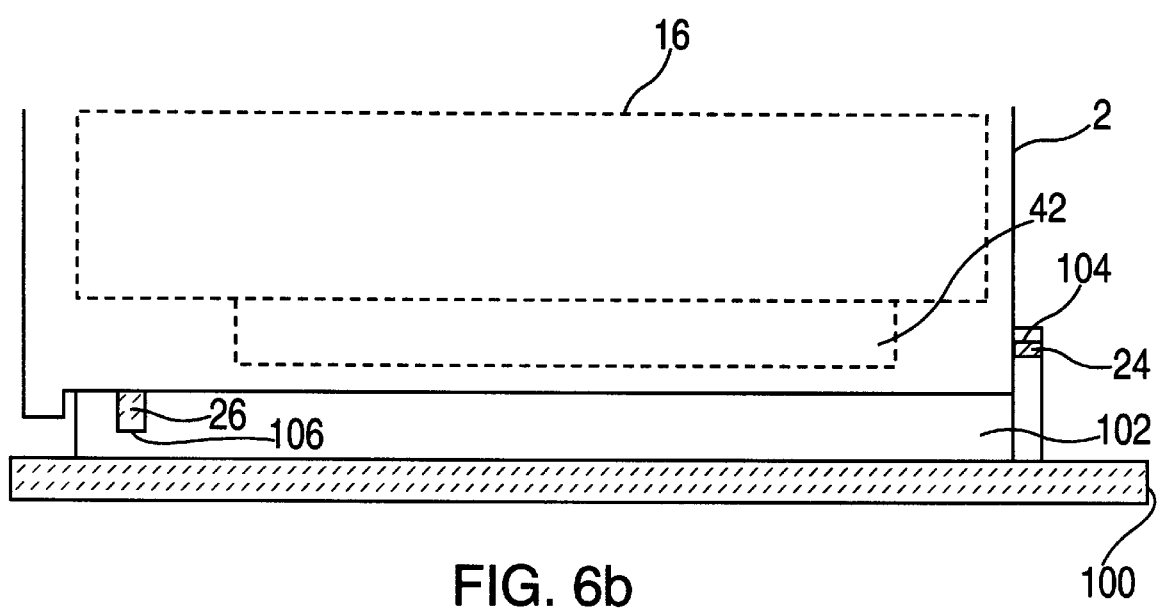
FIG. 6b is a side view of a docking cassette and a computer system main board after docking in accordance with an embodiment of the invention.
Figure 7:
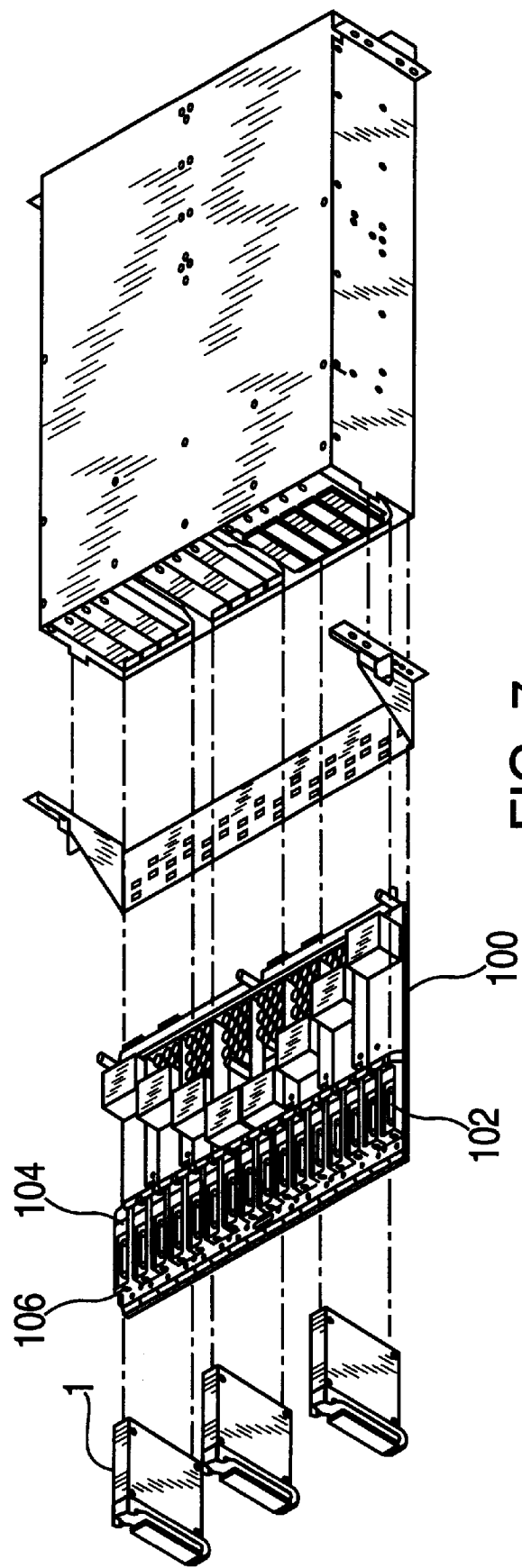
FIG. 7 is an exploded overall view of a docking cassette and a computer system in accordance with an embodiment of the invention.

Referring to FIG. 4, a linkage mechanism 4 is described and preferably includes a linkage handle 82, a linkage rail 84, a linkage mounting device 88 and a linkage compression device 86 having a linkage elbow 87. In accordance with an exemplary embodiment, linkage handle 82 is preferably slidingly associated with linkage rail 84 and linkage elbow 87 is preferably movably associated with linkage rail 84. Moreover, linkage mechanism 4 is preferably configurable between an engagement configuration 90 and a disengagement configuration 92. Linkage mechanism 4 is disposed into the engagement configuration 90 by sliding linkage handle 82 along linkage rail 84 so as to cause linkage elbow 87 to move away from linkage rail 84. Linkage mechanism 4 is disposed into the disengagement configuration 92 by sliding linkage handle 82 along linkage rail 84 so as to cause linkage elbow 87 to move toward linkage rail 84. In accordance with an exemplary embodiment, although linkage mounting device 88 is preferably a linkage opening for receiving a linkage mounting screw 91, linkage mounting device 88 may be any mounting device suitable to the desired end purpose, such as a clip.

Referring to the figures, a docking apparatus 1 containing a PCB 16 having a PCB mounting hole 17 is shown and discussed, wherein the docking apparatus 1 is disposed within a computer system. In accordance with an exemplary embodiment, linkage mechanism 4 is disposed within housing cavity 14 such that linkage mounting device 88 is communicated with linkage mounting receptacle 9. Linkage mechanism 4 is then non-movably associated with housing base 8 via linkage mounting device 88 and linkage mounting receptacle 9 using linkage mounting screw 91. In accordance with an exemplary embodiment, a PCB 16 is then disposed within housing cavity 14 so as to allow communication with PCB connector 42 and PCB cable connections 44 through PCB connector opening 20 and cable opening 18, respectively. In addition, PCB 16 is disposed within housing cavity 14 so as to allow communication with mounting device 38 through PCB mounting hole 17. PCB 16 is preferably movably associated with housing base 8 using PCB mounting mechanism 40. Moreover, PCB 16 preferably includes an opening 35 disposed so as to be communicated with linkage elbow 87 when PCB 16 is disposed within housing cavity 14. In accordance with an exemplary embodiment, although PCB 16 is preferably movably connected to linkage elbow 87 using an elbow screw 93, it is considered within the scope of the invention that PCB 16 may be movably connected to linkage elbow 87 using any device or method suitable to the desired end purpose. Furthermore, linkage mechanism is preferably disposed within housing cavity 14 so as to be associated with linkage cavity 33 thus allowing linkage elbow 87 to move without interference from housing base 8.

Linkage mechanism 4 is preferably disposed within housing cavity 14 so as to be movably associated with PCB 16 such that linkage handle 82 is protruding from cable opening 18. Linkage mechanism 4 is preferably disposed such that when linkage mechanism 4 is configured into engagement configuration 90, PCB 16 is compressed via compression device 86 such that PCB connector 42 is moved toward PCB connector opening 20. Likewise, when linkage mechanism 4 is configured into disengagement configuration 92, PCB 16 is decompressed such that PCB connector 42 is moved away from PCB connector opening 20. Housing cover 10 is then disposed over housing cavity 14 so as to allow communication with threaded cavity 30 through cover opening 46.

Inner bezel 48 is then disposed within tail-stock cavity 76 so as to be adjacent to tail-stock front 66 such that the tail-stock front opening 67 and forward opening 60 are also adjacent. Inner bezel 48 is then disposed such that tail-stock top 70 is communicated with housing cover 10. Outer bezel 50 is preferably disposed such that forward outer flange 62 is communicated with flanged opening 78 on tail-stock bottom 72. In addition, outer bezel 50 is also preferably disposed such that rear outer flange 64 is communicated with housing base 8. Housing bezel 6 is preferably disposed over cable opening 18 so as to enclose housing cavity 14. In addition, housing bezel 6 is preferably disposed such that tail-stock mounting hole 80 is communicated with cover opening 46 and threaded cavity 30. Housing cover 10, linkage mechanism 4 and tail-stock mechanism 52 is then non-movably associated with housing wall 12 using mounting apparatus 32.

In accordance with an exemplary embodiment, docking cassette 1 is then disposed onto a computer system main board 100 having a PCB connector receptacle 102, a first receptacle 104 and a second receptacle 106. Docking cassette 1 is preferably disposed onto computer system main board 100 such that PCB connector 42 is adjacent to PCB connector receptacle 102. In addition, docking cassette 1 is preferably disposed such that first protrusion 24 is communicated with first receptacle 104 and second protrusion 26 is communicated with second receptacle 106 so as to non-movably associate docking cassette 1 with computer system main board 100. Linkage mechanism 4 is then configured from the disengagement configuration 92 into the engagement configuration 90. This is done by sliding linkage handle 82 along linkage rail 84 so as to cause linkage elbow 87 to move away from linkage rail 84. This causes compression device 86 to compress PCB 16 in such a manner so as to electrically communicate PCB connector 42 and PCB connector receptacle 102. Likewise, sliding linkage handle 82 along linkage rail 84 so as to cause linkage elbow 87 to move toward linkage rail 84 will cause compression device 86 to decompress PCB 16 in such a manner so as to electrically discommunicate PCB connector 42 and PCB connector receptacle 102.

In accordance with an embodiment of the invention, housing base 8 and housing wall 12 are preferably constructed from a rigid material such as plastic (polycarbonate with glass filler). However, it is considered within the scope of the invention that housing base 8 and housing wall 12 may be constructed from any material suitable to the desired end purpose.

In accordance with an embodiment of the invention, housing cover 10 is preferably constructed from a rigid material such as plastic. However, it is considered within the scope of the invention that housing cover 10 may be constructed from any material suitable to the desired end purpose.

In accordance with an embodiment of the invention, linkage mechanism 4 is preferably constructed from a rigid material having sufficient strength, such as steel and/or stainless steel. However, it is considered within the scope of the invention that linkage mechanism 4 may be constructed from any material suitable to the desired end purpose.

In accordance with an embodiment of the invention, outer bezel 50 is preferably constructed from a rigid material having sufficient strength and electromagnetic compatibility properties, such as beryllium copper and/or stainless steel. However, it is considered within the scope of the invention that outer bezel 50 may be constructed from any material suitable to the desired end purpose.

In accordance with an embodiment of the invention, inner bezel 48 and tail-stock mechanism 52 are preferably constructed from a rigid material having sufficient strength, such as steel and/or stainless steel. However, it is considered within the scope of the invention that inner bezel 48 and tail-stock mechanism 52 may be constructed from any material suitable to the desired end purpose.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A docking apparatus for printed circuit boards comprising:

a cassette housing, having a housing base, a housing cover and a housing wall, wherein said housing base and said housing wall are disposed relative to each other so as to define a housing cavity for containing a printed circuit board and wherein said housing wall includes a cable opening disposed so as to be communicated with said housing cavity;

a linkage mechanism, wherein said linkage mechanism includes an engagement configuration and a disengagement configuration and wherein said linkage mechanism is disposed so as to be associated with said cassette housing; and a housing bezel, wherein said housing bezel is disposed relative to said cassette housing so as to be associated with said cable opening and wherein said housing bezel includes an inner bezel, an outer bezel and a tail-stock mechanism, wherein said tail-stock mechanism includes a tail-stock front having a tail-stock front opening and a tail-stock wall having a tail-stock top, a tail-stock bottom and a tail-stock side.

2. A docking apparatus according to claim 1, wherein said housing cover is non-movably associated with said housing wall.

3. A docking apparatus according to claim 1, wherein said housing cover is removably connected to said housing wall using screws.

4. A docking apparatus according to claim 1, wherein said housing cover is removably connected to said housing wall using clips.

5. A docking apparatus according to claim 1, wherein said cassette housing further includes a PCB connector opening disposed so as to be communicated with said housing cavity.

6. A docking apparatus according to claim 1, wherein said cassette housing includes a mounting device for movably containing a printed circuit board.

7. A docking apparatus according to claim 1, wherein said cassette housing includes a protrusion for non-movably communicating said cassette housing with a computer system.

8. A docking apparatus according to claim 1, wherein said housing bezel and said cassette housing are non-movably associated using a screw.

9. A docking apparatus according to claim 1, wherein said housing bezel and said cassette housing are non-movably associated using a clip.

10. A docking apparatus according to claim 1, wherein said linkage mechanism is disposed relative to said cassette housing so as to be partially disposed within said housing cavity.

11. A docking apparatus according to claim 1, wherein said linkage mechanism includes a linkage handle, a linkage rail, a linkage mounting device and a linkage compression device, wherein said linkage compression device is movably associated with said linkage rail.

12. A docking apparatus according to claim 11, wherein when said linkage mechanism is in said engagement configuration, said linkage compression device is compressingly associated with said printed circuit board and wherein when said linkage mechanism is in said disengagemnent configuration said linkage compression device is non-compressingly associated with said printed circuit board.

13. A docking apparatus according to claim 1, wherein said tail-stock front and said tail-stock wall define a tail-stock cavity.

14. A docking apparatus according to claim 1, wherein said tail-stock bottom includes a flanged opening.

15. A docking apparatus according to claim 1, wherein said outer bezel includes a forward outer flange and a rear outer flange.

16. A docking apparatus according to claim 1, wherein said inner bezel includes a forward bezel wall having a forward opening.

* * * * *